(12) United States Patent
Kuriyama et al.

(10) Patent No.: US 7,285,229 B2
(45) Date of Patent: Oct. 23, 2007

(54) ETCHANT AND REPLENISHMENT SOLUTION THEREFOR, AND ETCHING METHOD AND METHOD FOR PRODUCING WIRING BOARD USING THE SAME

(75) Inventors: Masayo Kuriyama, Amagasaki (JP); Ryo Ogushi, Amagasaki (JP); Daisaku Akiyama, Amagasaki (JP); Kaoru Urushibata, Amagasaki (JP)

(73) Assignee: MEC Company, Ltd., Hyogo (JP)

( * ) Notice: Subject to any disclaimer, the term of this patent is extended or adjusted under 35 U.S.C. 154(b) by 326 days.

(21) Appl. No.: 10/979,267

(22) Filed: Nov. 2, 2004

(65) Prior Publication Data

US 2005/0109734 A1 May 26, 2005

(30) Foreign Application Priority Data

Nov. 7, 2003 (JP) ............................. 2003-378488

(51) Int. Cl.
*C09K 13/00* (2006.01)
*C09K 13/04* (2006.01)
*C03C 25/68* (2006.01)
*C23F 1/00* (2006.01)
*C25F 3/00* (2006.01)
*B44C 1/22* (2006.01)

(52) U.S. Cl. ................... 216/108; 216/18; 216/75; 216/77; 216/78; 216/103; 216/106; 252/79.1; 252/79.2

(58) Field of Classification Search .............. 216/18, 216/75, 77–78, 79.2, 103, 106, 108; 252/79.1, 252/79.2
See application file for complete search history.

(56) References Cited

U.S. PATENT DOCUMENTS 4,868,071 A * 9/1989 Walsh et al. ............... 428/626
5,294,291 A * 3/1994 Akahoshi et al. ............ 216/12
6,156,221 A * 12/2000 Lauffer et al. .............. 216/105
6,841,084 B2 * 1/2005 Lillie et al. ................ 216/100
2002/0125215 A1 * 9/2002 Davis et al. ................ 216/100

FOREIGN PATENT DOCUMENTS

| DE | 100 39 684 A1 | * | 8/2000 |
| JP | 52077839 A | * | 6/1977 |
| JP | 2000-252625 A | | 9/2000 |
| JP | 2005023340 A | * | 1/2005 |
| JP | 2006324362 A | * | 11/2006 |

* cited by examiner

*Primary Examiner*—Ram N. Kackar
*Assistant Examiner*—Viji Narasimhan Bernard
(74) *Attorney, Agent, or Firm*—Hamre, Schumann, Mueller & Larson, P.C.

(57) ABSTRACT

An etchant of the present invention includes an aqueous solution containing hydrochloric acid, nitric acid, and a cupric ion source. An etching method of the present invention includes bringing the etchant into contact with at least one metal selected from nickel, chromium, nickel-chromium alloys, and palladium. Another etching method of the present invention includes bringing a first etchant that includes an aqueous solution containing at least the following components A to C (A. hydrochloric acid; B. at least one compound selected from the following (a) to (c): (a) compounds with 7 or less carbon atoms, containing a sulfur atom(s) and at least one group selected from an amino group, an imino group, a carboxyl group, a carbonyl group, and a hydroxyl group; (b) thiazole; and (c) thiazole compounds; and C. a surfactant) into contact with a surface of the metal, and then bringing a second solution that includes an aqueous solution containing hydrochloric acid, nitric acid, and a cupric ion source into contact with the surface of the metal. According to the etchant and the etching methods of the present invention, it is possible to etch at least one metal selected from nickel, chromium, nickel-chromium alloys, and palladium quickly and suppress excessive dissolution of copper.

11 Claims, No Drawings

ETCHANT AND REPLENISHMENT SOLUTION THEREFOR, AND ETCHING METHOD AND METHOD FOR PRODUCING WIRING BOARD USING THE SAME

FIELD OF THE INVENTION

The present invention relates to an etchant for at least one metal selected from nickel, chromium, nickel-chromium alloys, and palladium, a replenishment solution for the etchant, and an etching method and a method for producing a wiring board using the etchant and the replenishment solution.

BACKGROUND OF THE INVENTION

Among various wiring boards used in electronic equipment, there is an increasing demand for a flexible wiring board because of its flexibility, small thickness, light weight, etc. Furthermore, the use of the flexible wiring board as a base material of a semiconductor package or a package for a liquid-crystal module also is increasing. The flexible wiring board includes a polyimide film as an electrically insulating base material and a copper wiring formed on the polyimide film.

Among various methods for producing the flexible wiring board, a sputtering-plating method is attracting attention because minute wirings can be formed easily by this method, for example. According to the sputtering-plating method, the flexible wiring board is produced in the following manner. First, a thin layer of chromium, a nickel-chromium alloy, or the like, which serves to adhere polyimide and copper, is formed on the polyimide film as a base material. Then, a copper layer is formed by electrolytic plating on a portion where a wiring circuit is to be formed. Thereafter, a portion of the thin layer that is not covered with the copper layer is removed by etching, thus forming a copper wiring (see JP 2000-252625 A).

The removal of the thin layer generally is carried out using an aqueous solution that contains ferric chloride as a main component.

However, the conventional aqueous solution that contains ferric chloride as a main component has a problem in that it may cause too much dissolution of copper.

SUMMARY OF THE INVENTION

Therefore, in order to solve the above-described problem in the prior art, it is an object of the present invention to provide an etchant that can etch at least one metal selected from nickel, chromium, nickel-chromium alloys, and palladium quickly and can suppress too much dissolution (also referred to as "excessive dissolution") of copper, a replenishment solution for the etchant, and an etching method and a method for producing a wiring board using the etchant and the replenishment solution.

The present invention provides an etchant for at least one metal selected from nickel, chromium, nickel-chromium alloys, and palladium. The etchant includes an aqueous solution containing hydrochloric acid, nitric acid, and a cupric ion source.

Also, the present invention provides a replenishment solution to be added to the etchant of the present invention when the etchant is used repeatedly. The replenishment solution is an aqueous solution containing 0.1 to 35 mass % of hydrochloric acid and 0.1 to 20 mass % of nitric acid, with the replenishment solution being taken as 100 mass %.

Also, the present invention provides a method for etching at least one metal selected from nickel, chromium, nickel-chromium alloys, and palladium. The method includes: bringing an etchant including an aqueous solution containing hydrochloric acid, nitric acid, and a cupric ion source into contact with the metal.

Also, the present invention provides another method for etching at least one metal selected from nickel, chromium, nickel-chromium alloys, and palladium. The method includes: bringing a first etchant into contact with a surface of the metal and then bringing a second etchant into contact with the surface of the metal. The first etchant includes an aqueous solution containing at least the following components A to C, and the second etchant includes an aqueous solution containing hydrochloric acid, nitric acid, and a cupric ion source.

A. hydrochloric acid

B. at least one compound selected from the following (a) to (c): (a) compounds with 7 or less carbon atoms, containing a sulfur atom(s) and at least one group selected from an amino group, an imino group, a carboxyl group, a carbonyl group, and a hydroxyl group; (b) thiazole; and (c) thiazole compounds C: a surfactant Also, the present invention provides a method for producing a wiring board. The method includes: bringing a first etchant into contact with a portion of a surface of nickel, chromium, or a nickel-chromium alloy present on an electrically insulating base material, the portion being not covered with a copper wiring; and then bringing a second etchant into contact with the portion so as to dissolve the nickel, chromium, or nickel-chromium alloy. The first etchant includes an aqueous solution containing at least the following components A to C, and the second etchant includes an aqueous solution containing hydrochloric acid, nitric acid, and a cupric ion source.

A. hydrochloric acid

B. at least one compound selected from the following (a) to (c): (a) compounds with 7 or less carbon atoms, containing a sulfur atom(s) and at least one group selected from an amino group, an imino group, a carboxyl group, a carbonyl group, and a hydroxyl group; (b) thiazole;

and (c) thiazole compounds

C. a surfactant

Also, the present invention provides another method for producing a wiring board. The method includes: bringing a first etchant into contact with a palladium catalyst for electroless copper plating present in a gap of a wiring on an electrically insulating base material; and then bringing a second etchant into contact with the palladium catalyst so as to dissolve the palladium catalyst. The first etchant includes an aqueous solution containing at least the following components A to C, and the second etchant includes an aqueous solution containing hydrochloric acid, nitric acid, and a cupric ion source.

A. hydrochloric acid

B. at least one compound selected from the following (a) to (c): (a) compounds with 7 or less carbon atoms, containing a sulfur atom(s) and at least one group selected from an amino group, an imino group, a carboxyl group, a carbonyl group, and a hydroxyl group; (b) thiazole;

and (c) thiazole compounds

C. a surfactant

These and other advantages of the present invention will become apparent to those skilled in the art upon reading and understanding the following detailed description.

DETAILED DESCRIPTION OF THE INVENTION (1) Etchant

An etchant according to the present invention includes an aqueous solution containing hydrochloric acid, nitric acid, and a cupric ion source.

The etchant of the present invention can achieve a high etching rate for nickel, chromium, nickel-chromium alloys, and palladium, so that a material to be treated needs to be in contact with the etchant only for a short time. Thus, when a material in which copper is present with nickel, chromium, a nickel-chromium alloy, or palladium is to be treated, only a small amount of copper is dissolved because the copper is in contact with the etchant only for a short time.

The concentration of the hydrochloric acid is 0.1% to 35% ("%" represents "mass %", hereinafter the same), preferably 5% to 20%, and more preferably 10% to 15%. When the concentration of the hydrochloric acid is less than 0.1%, a sufficiently high etching rate cannot be obtained. On the other hand, when the concentration of the hydrochloric acid is more than 35%, the etchant has a strong odor and thus is not preferable for the working environment.

The concentration of the nitric acid is 0.1% to 20%, preferably 0.5% to 15%, and more preferably 1% to 10%. When the concentration of the nitric acid is less than 0.1%, a sufficiently high etching rate cannot be obtained. On the other hand, when the concentration of the nitric acid is more than 20%, excessive dissolution of copper may be caused.

Examples of the cupric ion source include cupric chloride, cupric sulfate, and cupric oxide. The concentration of the cupric ion source, measured as the concentration of copper, is 0.00001% to 0.1%, preferably 0.0001% to 0.05%, and more preferably 0.001% to 0.01%. When the concentration of the cupric ion source is less than 0.00001%, a sufficiently high etching rate cannot be obtained. On the other hand, when the concentration of the cupric ion source is more than 0.1%, excessive dissolution of copper may be caused when nickel, chromium, a nickel-chromium alloy, or palladium is present with the copper.

In the above-described etchant, the remainder may be water.

Preferably, the etchant of the present invention further contains sulfuric acid in order to further increase the etching rate for nickel, chromium, a nickel-chromium alloy, or palladium. The concentration of the sulfuric acid preferably is 1% to 60%, more preferably 5% to 30%, and particularly preferably 10% to 15%. When the concentration of the sulfuric acid is less than 1%, the sulfuric acid cannot exhibit an effect of increasing the etching rate sufficiently. On the other hand, when the concentration of the sulfuric acid is more than 60%, the etchant has a strong odor and thus is not preferable for the working environment.

Preferably, the etchant of the present invention further contains a surfactant in order to prevent a copper surface from being eroded. As the surfactant, generally-know surfactants such as cationic surfactants, anionic surfactants, amphoteric surfactants, and nonionic surfactants may be used. The concentration of the surfactant preferably is 0.001% to 1%, more preferably 0.01% to 0.1%, and particularly preferably 0.01% to 0.05%. When the concentration of the surfactant is less than 0.001%, the surfactant cannot exhibit an effect of preventing a copper surface from being eroded sufficiently. On the other hand, when the concentration of the surfactant is more than 1%, considerable foaming occurs.

If necessary, the etchant of the present invention further may contain other components as appropriate. Examples of other components include an antifoaming agent for suppressing the foaming and a rust-preventive agent for preventing copper from discoloring.

The etchant can be prepared easily by dissolving the above-described respective components in water. As the water, it is preferable to use water from which ionic substances and impurities have been removed, such as ion exchanged water, pure water, and ultrapure water.

(2) Replenishment Solution

A replenishment solution according to the present invention can be used suitably when the etchant of the present invention is used repeatedly for etching nickel, chromium, a nickel-chromium alloy, or palladium on a base material in which copper also is present. By adding the replenishment solution to the etchant, the ratio of the respective components in the etchant can be maintained appropriately. Thus, it is possible to etch nickel, chromium, a nickel-chromium alloy, or palladium stably while suppressing the dissolution of copper. The replenishment solution is an aqueous solution containing 0.1% to 35% of hydrochloric acid and 0.1% to 20% of nitric acid, with the replenishment solution being taken as 100%.

The replenishment solution also further may contain sulfuric acid, a surfactant, an antifoaming agent, a rust-preventive agent for copper, and the like, as in the case of the etchant.

(3) Etching Method

Examples of a method of using the etchant of the present invention include an immersion method and a spray method. However, when copper is present with nickel, chromium, a nickel-chromium alloy, or palladium, the immersion method is preferable in terms of ease of suppressing the dissolution of copper. In general, the etchant is used at a temperature of 20° C. to 50° C.

For example, the etchant of the present invention can dissolve a 0.1 μm thick chromium film on a base material in a short time of about 3 to 5 minutes. Also, it can dissolve a 0.1 μm thick nickel film on a base material in a short time of about 1 to 2 minutes, for example. Furthermore, it can dissolve a 0.1 μm thick nickel-chromium alloy film (Ni 70-Cr 30) on a base material in a short time of about 2 to 3 minutes, for example. Still further, it can dissolve palladium that is present on a base material as a catalyst for electroless copper plating in a short time of about 5 to 20 seconds, for example.

(4) Etching Method Using a First Etchant and a Second Etchant

An etching method using a first etchant and a second etchant according to the present invention is for etching at least one metal selected from nickel, chromium, nickel-chromium alloys, and palladium. The method includes: bringing a first etchant that includes an aqueous solution containing at least the following components A to C into contact with a surface of the metal; and then bringing a second etchant that includes an aqueous solution containing hydrochloric acid, nitric acid, and a cupric ion source with the surface of the metal.

A. hydrochloric acid

B. at least one compound selected from the following (a) to (c): (a) compounds with 7 or less carbon atoms, containing a sulfur atom(s) and at least one group selected from an amino group, an imino group, a carboxyl group, a carbonyl group, and a hydroxyl group; (b) thiazole; and (c) thiazole compounds C. a surfactant When a passive film such as an oxide film is formed on a surface of nickel, chromium, a nickel-chromium alloy, or palladium, or when nickel, chromium, a nickel-chromium alloy, or palladium is thick, a sufficiently high etching rate may not be attained only by the use of the etchant of the present invention (the second etchant). In such cases, by using the etching method that uses the first and second etchants according to the present invention, it is possible to etch nickel, chromium, a nickel-chromium alloy, or palladium quickly.

(4-1) First Etchant

By using the first etchant, a passive film, such as an oxide film, formed on a surface of nickel, chromium, a nickel-chromium alloy, or palladium can be removed quickly. In particular, when a material in which copper is present with nickel, chromium, a nickel-chromium alloy, or palladium is to be treated, the first etchant hardly dissolves the copper.

The concentration of the hydrochloric acid in the first etchant is 0.1% to 35%, preferably 5% to 20%, and more preferably 10% to 15%. When the concentration of the hydrochloric acid is less than 0.1%, a sufficiently high etching rate for a passive film, such as an oxide film, formed on a surface of nickel, chromium, a nickel-chromium alloy, or palladium cannot be obtained. On the other hand, when the concentration of the hydrochloric acid is more than 35%, the etchant has a strong odor and thus is not preferable for the working environment.

The compound with 7 or less carbon atoms, containing a sulfur atom and at least one group selected from an amino group, an imino group, a carboxyl group, a carbonyl group, and a hydroxyl group may be a urea compound containing a sulfur atom(s), such as thiourea, thioureadioxide, N-methylthiourea, 1,3-dimethylthiourea, 1,3-diethylthiourea, ethylene thiourea, or 2-thiobarbituric acid; carboxylic acid containing a sulfur atom(s), such as thioglycolic acid, β-mercaptopropionic acid, 2-mercaptopropionic acid, 2,2'-thiodiglycolic acid, thiomalic acid, mercaptosuccinic acid, Lcysteine, or L(−)-Cystine; alcohol containing a sulfur atom(s), such as thioglycol.

As the thiazole compound, those soluble in water are preferable. Specific examples thereof include 2-mercaptobenzothiazole.

The concentration of the compound containing a sulfur atom(s) is 0.01% to 30%, preferably 0.1% to 10%, and more preferably 0.1% to 1%. When the concentration of the compound containing a sulfur atom(s) is less than 0.01%, a sufficiently high etching rate cannot be obtained. On the other hand, when the concentration of the compound containing a sulfur atom(s) is more than 30%, an effect commensurate with the increase in the added amount of the compound cannot be obtained, resulting in high cost.

The surfactant is not particularly limited. Examples thereof include: cationic surfactants such as alkyldimethylbenzylammonium chloride, alkyltrimethylammonium salts, and alkylpyridinium salts; anionic surfactants such as alkylarylsulfonate, alpha olefin sulfonate, and alkylbenzene sulfonate; amphoteric surfactants such as amidopropyl betaine, aminoacetic acid betaine, and linear alkylamino acid; and nonionic surfactants such as polyoxyethylene lanolin ether, polyoxyethylene alkylphenol, polyoxyethylene fatty acid ester, fatty acid diethanolamide, and isopropanolamide.

The concentration of the surfactant preferably is 0.001% to 1%, more preferably 0.01% to 0.1%, and particularly preferably 0.01% to 0.05%. When the concentration of the surfactant is less than 0.001%, a sufficiently high etching rate for a passive film, such as an oxide film, formed on a surface of nickel, chromium, a nickel-chromium alloy, or palladium cannot be obtained. On the other hand, when the concentration of the surfactant is more than 1%, considerable foaming occurs.

If necessary, the first etchant further may contain other components as appropriate. Examples of other components include an antifoaming agent for suppressing the foaming and a rust-preventive agent for preventing copper from discoloring.

The first etchant can be prepared easily by dissolving the above-described respective components in water. As the water, it is preferable to use water from which ionic substances and impurities have been removed, such as ion exchanged water, pure water, and ultrapure water.

(4-2) Etching Method

The time period for which the first etchant is in contact with nickel, chromium, a nickel-hromium alloy, or palladium may be as short as about 1 to 60 seconds, preferably 5 to 10 seconds. When the contact time is too short, a passive film, such as an oxide film, formed on a surface of nickel, chromium, a nickel-chromium alloy, or palladium cannot be dissolved sufficiently. A longer contact time than is needed provides no advantages.

Examples of a method of using the first etchant include an immersion method and a spray method. However, the immersion method is preferable because the compound containing a sulfur atom(s) is less liable to be decomposed by the immersion method.

In general, the first etchant is used at a temperature of 20° C. to 50° C.

Next, the second etchant is brought into contact with the nickel, chromium, nickel-chromium alloy, or palladium. The time period for which the second etchant is in contact with the nickel, chromium, nickel-chromium alloy, or palladium may be determined as appropriate depending on the thickness of the metal to be dissolved or the like. For example, the contact time may be about 30 to 60 seconds when a 0.1 μm thick chromium film is to be dissolved, about 10 to 20 seconds when a 0.1 μm thick nickel film is to be dissolved, about 20 to 40 seconds when a 0.1 μm thick nickel-chromium alloy film (Ni 70-Cr 30) is to be dissolved, and about 1 to 10 seconds when palladium that is applied on an electrically insulating base material as a catalyst for electroless copper plating is to be dissolved.

When etching nickel, chromium, a nickel-chromium alloy, or palladium by the first and second etchants using an etching apparatus, one of the following procedures may be employed, for example: the first and second enchants may be prepared by mixing all the components therefor so as to have predetermined compositions, and then the thus-prepared first and second etchants may be supplied to the etching apparatus; the respective components for preparing the first and second etchants may be supplied to the etching apparatus separately, and the first and second enchants may be prepared in the etching apparatus by mixing the components so as to have predetermined compositions; or alternatively, some of the components for preparing the first and second etchants may be mixed in advance and supplied to the etching apparatus, and then the remaining components further may be supplied to the apparatus and mixed with the previously supplied mixtures so as to have predetermined compositions, thus preparing the first and second enchants. When supplying the respective components for the first and second etchants to the etching apparatus, the concentrations thereof are not particularly limited. For example, the components with higher concentrations may be supplied to the etching apparatus, and then the components may be diluted with water in the apparatus so as to adjust the concentrations thereof to desired values.

An etchant and an etching method according to the present invention are useful for producing a wiring board, for example. The following (a) to (c) are examples of a method for producing a wiring board.

(a) a method including: forming a layer of nickel, chromium, or a nickel-chromium alloy on an electrically insulating base material; forming a plating resist on this layer; then forming a copper layer by electrolytic copper plating only on a portion where a wiring circuit is to be formed; then removing the plating resist; and bringing a first etchant and then a second etchant into contact with the electrically insulating base material so as to dissolve a portion of the nickel, chromium, or nickel-chromium alloy layer that is not covered with the copper layer.

(b) a method including: forming a layer of nickel, chromium, or a nickel-chromium alloy on an electrically insulating base material; forming a copper layer on this layer; then covering a portion where a wiring circuit is to be formed with an etching resist; then bringing a copper etchant into contact with the electrically insulating base material so as to etch a portion of the copper that is not covered with the etching resist; and bringing a first etchant and then a second etchant into contact with the electrically insulating base material so as to dissolve a portion of the nickel, chromium, or nickel-chromium alloy layer that is exposed by the etching of the copper.

(c) a method including: applying a catalyst for electroless plating to an electrically insulating base material; carrying out electroless copper plating and then electrolytic copper plating; covering a portion where a wiring circuit is to be formed with an etching resist; bringing a copper etchant into contact with the electrically insulating base material so as to etch a portion of the copper (the copper layer formed by the electroless copper plating and the copper layer formed by the electrolytic copper plating) that is not covered with the etching resist; and bringing a first etchant and then a second etchant into contact with the electrically insulating base material so as to dissolve the catalyst (palladium) for the electroless plating remaining on the electrically insulating base material that is exposed by the etching of the copper.

Examples of a material for the electrically insulating base material include: thermoplastic resins such as AS resin, ABS resin, fluorocarbon resins, polyamide, polyethylene, polyethylene terephthalate, polyvinylidene chloride, polyvinyl chloride, polycarbonate, polystyrene, polysulphone, polypropylene, and liquid crystal polymers; and thermosetting resins such as epoxy resins, phenol resins, polyimide, polyurethane, bismaleimide-triazine resin, and modified polyphenylene ethers. These resins may be reinforced with glass fibers, aramid fibers, or the like. Also, ceramic, glass, or the like may be used as a material for the electrically insulating base material.

The layer of nickel, chromium, or a nickel-chromium alloy is formed by electroless plating, sputtering, vacuum evaporation, or the like. The copper layer is formed by electroless plating, electrolytic plating, or the like.

According to the etching method of the present invention, even when the layer of nickel, chromium, or a nickel-chromium alloy is as thick as 0.1 µm, for example, the layer can be dissolved quickly, while causing little change in the shape of the copper layer formed by electrolytic copper plating. Also, palladium as a catalyst for electroless plating remaining on the base material can be dissolved quickly.

According to the etchant and the etching method of the present invention, it is possible to etch nickel, chromium, or a nickel-chromium alloy quickly.

Furthermore, according to the etchant and the etching method of the present invention, palladium can be etched quickly. Palladium is used as a catalyst for electroless copper plating in the production of a wiring board. However, there have been problems that palladium remaining on a surface of an electrically insulating base material may deteriorate the insulation performance of the base material and that it may cause gold to be deposited on an undesired portion in a subsequent gold plating process. The present invention also is useful for the removal of such palladium.

The etchant of the present invention can etch nickel, chromium, nickel-hromium alloys, and palladium quickly, so that a material to be treated needs to be in contact with the etchant only for a short time. Thus, when a material in which copper is present with nickel, chromium, a nickel-chromium alloy, or palladium is to be treated, only a small amount of copper is dissolved because the copper is in contact with the etchant only for a short time.

Furthermore, according to the etching method that uses a first etchant and a second etchant according to the present invention, nickel, chromium, a nickel-chromium alloy, or palladium can be etched quickly even when a passive film such as an oxide film is formed on a surface thereof.

In the present invention, the atomic ratio of Ni to Cr in nickel-chromium alloys is not particularly limited. For example, Ni and Cr may be present in the ratio (weight ratio) of Ni:Cr=6:1, 7:1, or 1:3.

EXAMPLES

Hereinafter, the present invention will be described more specifically by way of examples and comparative examples.

Examples 1 to 5 and Comparative Examples 1 and 2

Components shown in Table 1 were mixed to prepare etchants of Examples 1 to 5 and Comparative Examples 1 and 2.

(1) Etching of Nickel-Chromium Alloy

Polyimide films, each including a 0.1 µm thick nickel-chromium alloy film (Ni 88-Cr 12) formed by sputtering, were immersed in the respective etchants kept at 40° C. so as to dissolve the nickel-chromium alloy films. With regard to the respective polyimide films, the time periods required until nickel and chromium on their surfaces became no longer detectable with an X-ray fluorescence spectrometer were determined. The results are shown in Table 1.

On the other hand, copper foils (40 mm in length, 40 mm in width, 35 µm in thickness, 0.50 g in weight) were immersed in the respective etchants kept at 40° C. for the time periods determined in the above, respectively. Then, with regard to the respective copper foils, the amounts of copper dissolved were determined from the change in their weight. The results are shown in Table 1.

(2) Etching of Palladium

Glass fabric base materials impregnated with epoxy resin were pretreated for electroless copper plating so as to attach a palladium catalyst on their surfaces. The thus-treated base materials then were immersed in the respective etchants kept at 40° C. so as to dissolve the palladium catalysts. With regard to the respective base materials, the time periods required until palladium on their surfaces became no longer detectable by ESCA (X-ray photoelectron spectroscopy) were determined. The results are shown in Table 1. On the other hand, copper foils (40 mm in length, 40 mm in width, 35 μm in thickness, 0.50 g in weight) were immersed in the respective etchants kept at 40° C. for the time periods determined in the above, respectively. Then, with regard to the respective copper foils, the amounts of copper dissolved were determined from the change in their weight. The results are shown in Table 1.

20 seconds. Also, according to the etchants of the present invention, the weight loss of the copper foils was very small. For example, when the copper foil was immersed in the etchant for 150 seconds, the weight loss was only 0.03 g.

In contrast, as can be seen from Table 1, the generally-known etchant containing ferric chloride as a main component (Comparative Example 2) took 180 seconds to dissolve the nickel-chromium alloy and 30 seconds to dissolve palladium. Moreover, the weight loss of the copper foil was 0.48 g when the copper foil was immersed in the etchant for 180 seconds.

These results demonstrate that an etchant according to the present invention can achieve a high etching rate and dissolves only a small amount of copper.

Examples 6 to 10

Components shown in Table 2 were mixed so as to prepare etchants (a first etchant and a second etchant) of Examples 6 to 10.

(1) Etching of Nickel-Chromium Alloy

Polyimide films, each including a 0.1 μm thick nickel-chromium alloy film (Ni 88-Cr 12) formed by sputtering,

TABLE 1

| Ex. No. | 1st etchant | 2nd etchant | Composition (mass %) | * | ** |
|---|---|---|---|---|---|
| Ex. 1 | none | sulfuric acid | 10 | | |
| | | hydrochloric acid | 10 | 150 sec | 20 sec |
| | | nitric acid | 5 | | |
| | | cupric chloride | 0.001 (as copper) | 0.03 g | 0.00 g |
| | | sodium alpha olefin sulphonate | 0.1 | | |
| | | ion exchanged water | remainder | | |
| Ex. 2 | none | sulfuric acid | 2 | | |
| | | hydrochloric acid | 25 | 120 sec | 10 sec |
| | | nitric acid | 10 | | |
| | | cupric sulfate | 0.005 (as copper) | 0.02 g | 0.00 g |
| | | ion exchanged water | remainder | | |
| Ex. 3 | none | sulfuric acid | 20 | | |
| | | hydrochloric acid | 5 | 120 sec | 20 sec |
| | | nitric acid | 2 | | |
| | | cupric nitrate | 0.01 (as copper) | 0.02 g | 0.00 g |
| | | amidopropyl betaine | 0.05 | | |
| | | ion exchanged water | remainder | | |
| Ex. 4 | none | hydrochloric acid | 10 | | |
| | | nitric acid | 10 | 150 sec | 20 sec |
| | | cupric oxide | 0.002 (as copper) | | |
| | | propyl trimethylammonium | 0.5 | 0.03 g | 0.00 g |
| | | ion exchanged water | remainder | | |
| Ex. 5 | none | hydrochloric acid | 30 | | |
| | | nitric acid | 1 | 120 sec | 5 sec |
| | | cupric oxide | 0.00001 (as copper) | 0.02 g | 0.00 g |
| | | ion exchanged water | remainder | | |
| Comp. Ex. 1 | none | hydrochloric acid | 5 | at least 600 sec | at least 600 sec |
| | | sulfuric acid | 5 | | |
| | | ion exchanged water | remainder | at least 0.70 g | at least 0.70 g |
| Comp. Ex. 2 | none | hydrochloric acid | 5 | 180 sec | 30 sec |
| | | ferric chloride | 30 (as iron) | | |
| | | cupric chloride | 1 (as copper) | 0.48 g | 0.08 g |
| | | ion exchanged water | remainder | | |

* time required for nickel-chromium alloy dissolution and weight loss of copper foil
** time required for palladium dissolution and weight loss of copper foil As can be seen from the results with regard to Examples 1 to 5 shown in Table 1, the etchants according to the present invention could dissolve the nickel-chromium alloy of 0.1 μm thickness in a short time of 120 to 150 seconds, and could dissolve the palladium catalyst in a short time of 10 to were immersed in the respective first etchants kept at 40° C. for 5 seconds. Thereafter, the polyimide films were immersed in the respective second etchants kept at 40° C. so as to dissolve the nickel-chromium alloy films. With regard to the respective polyimide films, the time periods required until Ni and Cr on their surfaces became no longer detectable with an X-ray fluorescence spectrometer i.e., the time periods for which the respective polyimide films were immersed in the second etchants) were determined. The results are shown in Table 2. Also, copper foils (40 mm in length, 40 mm in width, 35 μm in thickness, 0.50 g in weight) were immersed in the respective first and second etchants kept at the same temperature for the same time periods as in the above, respectively. Then, with regard to the respective copper foils, the amounts of copper dissolved were determined from the change in their weight. The results are shown in Table 2.

(2) Etching of Palladium

Glass fabric base materials impregnated with epoxy resin were pretreated for electroless copper plating so as to attach a palladium catalyst on their surfaces. The thus-treated base materials were then immersed in the respective first etchants kept at 40° C. for 5 seconds. Thereafter, the base materials were immersed in the respective second etchants kept at 40° C. so as to dissolve the palladium catalysts. With regard to the respective base materials, the time periods required until palladium on their surfaces became no longer detectable by ESCA (X-ray photoelectron spectroscopy) (i.e., the time periods for which the respective base materials were immersed in the second etchants) were determined. The results are shown in Table 2. On the other hand, copper foils (40 mm in length, 40 mm in width, 35 μm in thickness, 0.50 g in weight) were immersed in the first etchants kept at 40° C. and then in the second etchants kept at 40° C. for the same time periods as in the above, respectively. Then, with regard to the respective copper foils, the amounts of copper dissolved were determined from the change in their weight. The results are shown in Table 2.

TABLE 2

| Ex. No. | 1st etchant | | 2nd etchant | | * | ** |
|---|---|---|---|---|---|---|
| Ex. 6 | sulfuric acid | 3 | sulfuric acid | 10 | | |
| | hydrochloric acid | 10 | hydrochloric acid | 10 | | |
| | thiourea | 1 | nitric acid | 5 | | |
| | sodium alpha olefin sulphonate | 0.1 | cupric chloride | 0.001 (as copper) | 30 sec | 10 sec |
| | ion exchanged water | remainder | sodium alpha olefin sulphonate | 0.1 | 0.00 g | 0.00 g |
| | | | ion exchanged water | remainder | | |
| Ex. 7 | sulfuric acid | 20 | sulfuric acid | 2 | | |
| | hydrochloric acid | 7 | hydrochloric acid | 25 | | |
| | N-methylthiourea | 3 | nitric acid | 10 | | |
| | isopropanolamide | 0.3 | cupric sulfate | 0.005 (as copper) | 20 sec | 5 sec |
| | ion exchanged water | remainder | isopropanolamide | 0.3 | 0.00 g | 0.00 g |
| | | | ion exchanged water | remainder | | |
| Ex. 8 | sulfuric acid | 8 | sulfuric acid | 20 | | |
| | hydrochloric acid | 5 | hydrochloric acid | 5 | | |
| | thioglycollic acid | 0.2 | nitric acid | 2 | | |
| | Lauryldimethylbenzyl ammonium chloride | 0.2 | cupric nitrate | 0.002 (as copper) | 20 sec | 5 sec |
| | ion exchanged water | remainder | Lauryldimethylbenzyl ammonium chloride | 0.2 | 0.00 g | 0.00 g |
| | | | ion exchanged water | remainder | | |
| Ex. 9 | hydrochloric acid | 10 | hydrochloric acid | 10 | | |
| | β-mercaptopropionic acid | 5 | nitric acid | 10 | | |
| | polyoxyethylene fatty acid ester | 0.05 | cupric oxide | 0.01 (as copper) | 30 sec | 5 sec |
| | ion exchanged water | remainder | polyoxyethylene fatty acid ester | 0.05 | 0.00 g | 0.00 g |
| | | | ion exchanged water | remainder | | |
| Ex. 10 | sulfuric acid | 3 | hydrochloric acid | 30 | | |
| | hydrochloric acid | 30 | nitric acid | 1 | | |
| | 2-mercaptobenzothiazole | 1 | cupric oxide | 0.00001 (as copper) | 20 sec | 5 sec |
| | amidopropyl betaine | 0.01 | | | | |
| | ion exchanged water | remainder | ion exchanged water | remainder | 0.00 g | 0.00 g |

\* time required for nickel-chromium alloy dissolution and weight loss of copper foil
\*\* time required for palladium dissolution and weight loss of copper foil As can be seen from the results with regard to Examples 6 to 10 shown in Table 2, by the etching method that uses two types of etchants according to the present invention, the nickel-chromium alloy of 0.1 μm thickness could be dissolved in a short time of 20 to 30 seconds and the palladium catalyst could be dissolved in a short time of 5 to 10 seconds. Moreover, no weight loss of the copper foils was observed.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for etching at least one metal selected from nickel, chromium, nickel-chromium alloys, and palladium, comprising:

bringing an etchant comprising an aqueous solution comprising hydrochloric acid, nitric acid, and a cupric ion source into contact with the metal;

wherein the etchant comprising the aqueous solution comprising the hydrochloric acid, the nitric acid, and the cupric ion source is used as a second etchant, and the method further comprises bringing a first etchant into contact with the metal before bringing the second etchant into contact with the metal, the first etchant comprising an aqueous solution comprising at least the following components A to C:

A. hydrochloric acid;

B. at least one compound selected from the following (a) to (c):
  (a) compounds with 7 or less carbon atoms, containing a sulfur atom and at least one group selected from an amino group, an imino group, a carboxyl group, a carbonyl group, and a hydroxyl group;
  (b) thiazole; and
  (c) thiazole compounds and C. a surfactant.

2. The method according to claim 1, wherein the etchant further comprises 1 to 60 mass % of sulfuric acid.

3. The method according to claim 1, wherein the etchant further comprises 0.00 1 to 1 mass % of a surfactant.

4. The method according to claim 1, wherein a replenishment solution is added to the etchant when the etchant is used repeatedly, and the replenishment solution is an aqueous solution in which a concentration of hydrochloric acid is in a range from 0.1 to 35 mass % and a concentration of nitric acid is in a range from 0.1 to 20 mass %, with the replenishment solution being taken as 100 mass %.

5. A method for producing a wiring board, comprising:
bringing a first etchant into contact with a portion of a surface of nickel, chromium, or a nickel-chromium alloy present on an electrically insulating base material, the portion being not covered with a copper wiring; and then bringing a second etchant into contact with the portion so as to dissolve the nickel, chromium, or nickel-chromium alloy, wherein the first etchant comprises an aqueous solution comprising at least the following components A to C:
A. hydrochloric acid;
B. at least one compound selected from the following (a) to (C): (a) compounds with 7 or less carbon atoms, containing a sulfur atom and at least one group selected from an amino group, an imino group, a carboxyl group, a carbonyl group, and a hydroxyl group (b) thiazole; and (c) thiazole compounds;
and
  C. a surfactant, and
the second etchant comprises an aqueous solution comprising hydrochloric acid, nitric acid, and a cupric ion source.

6. The method according to claim 5 wherein
the first etchant is the aqueous solution in which a concentration of the component A is in a range from 0.1 to 35 mass %, a concentration of the component B is in a range from 0.01 to 30 mass %, and a concentration of the component C is in a range from 0.001 to 1 mass %, with the first etchant being taken as 100 mass %, and the second etchant is the aqueous solution in which a concentration of the hydrochloric acid is in a range from 0.1 to 35 mass %, a concentration of the nitric acid is in a range from 0.1 to 20 mass %, and a concentration of a material containing the cupric ion source, measured as a concentration of copper, is in a range from 0.00001 to 0.1 mass %, with the second etchant being taken as 100 mass %.

7. A method for producing a wiring board, comprising:
bringing a first etchant into contact with a palladium catalyst for electroless copper plating present in a gap of a wiring on an electrically insulating base material; and then bringing a second etchant into contact with the palladium catalyst so as to dissolve the palladium catalyst, wherein the first etchant comprises an aqueous solution comprising at least the following components A to C:
  A. hydrochloric acid;
  B. at least one compound selected from the following (a) to (c): (a) compounds with 7 or less carbon atoms, containing a sulfur atom and at least one group selected from an amino group, an imino group, a carboxyl group, a carbonyl group, and a hydroxyl group (b) thiazole and (c) thiazole compounds and
  C. a surfactant, and the second etchant comprises an aqueous solution comprising hydrochloric acid, nitric acid, and a cupric ion source.

8. The method according to claim 7, wherein
the first etchant is the aqueous solution in which a concentration of the component A is in a range from 0.1 to 35 mass %, a concentration of the component B is in a range from 0.01 to 30 mass %, and a concentration of the component C is in a range from 0.00 1 to 1 mass %, with the first etchant being taken as 100 mass %, and the second etchant is the aqueous solution in which a concentration of the hydrochloric acid is in a range from 0.1 to 35 mass %, a concentration of the nitric acid is in a range from 0.1 to 20 mass %, and a concentration of a material containing the cupric ion source, measured as a concentration of copper, is in a range from 0.00001 to 0.1 mass %, with the second etchant being taken as 100 mass %.

9. A method for etching at least one metal selected from nickel, chromium, nickel-chromium alloys, and palladium, comprising:
bringing an etchant comprising an aqueous solution comprising hydrochloric acid, nitric acid, and a cupric ion source into contact with the metal;

wherein a replenishment solution is added to the etchant, and the replenishment solution is an aqueous solution in which a concentration of hydrochloric acid is in a range from 0.1 to 35 mass % and a concentration of nitric acid is in a range from 0.1 to 20 mass %, with the replenishment solution being taken as 100 mass %.

10. The method according to claim 9, wherein the etchant further comprises 1 to 60 mass % of sulfuric acid.

11. The method according to claim 9, wherein the etchant further comprises 0.001 to 1 mass % of a surfactant.

* * * * *